(12) United States Patent　(10) Patent No.: US 8,716,056 B2
Parkinson　(45) Date of Patent: May 6, 2014

(54) METHOD FOR FORMING CHALCOGENIDE SWITCH WITH CRYSTALLIZED THIN FILM DIODE ISOLATION

(75) Inventor: Ward Parkinson, Boise, ID (US)

(73) Assignee: Ovonyx, Inc., Sterling Heights, MI (US)

( * ) Notice: Subject to any disclaimer, the term of this patent is extended or adjusted under 35 U.S.C. 154(b) by 1198 days.

(21) Appl. No.: 12/564,386

(22) Filed: Sep. 22, 2009

(65) Prior Publication Data

US 2010/0009522 A1　Jan. 14, 2010

Related U.S. Application Data

(62) Division of application No. 11/501,255, filed on Aug. 8, 2006, now Pat. No. 7,838,864.

(51) Int. Cl.
*H01L 21/00*　(2006.01)

(52) U.S. Cl.
USPC .................................. 438/95; 257/E31.029

(58) Field of Classification Search
USPC ......... 438/128–130, 131, 257–259, 467, 600, 438/95; 257/E31.001, E31.027, E31.028, 257/E31.029
See application file for complete search history.

(56) References Cited

U.S. PATENT DOCUMENTS

| 6,780,711 B2 * | 8/2004 | Johnson et al. ............... 438/257 |
| 2005/0158950 A1 * | 7/2005 | Scheuerlein et al. .......... 438/257 |

* cited by examiner

*Primary Examiner* — Hung Vu

(74) *Attorney, Agent, or Firm* — Kevin L. Bray

(57) ABSTRACT

A three-dimensional memory array formed of one or more two-dimensional memory arrays of one-time programmable memory elements arranged in horizontal layers and stacked vertically upon one another; and a two-dimensional memory array of reprogrammable phase change memory elements stacked on the one or more two-dimensional memory arrays as the top layer of the three-dimensional memory array.

2 Claims, 5 Drawing Sheets

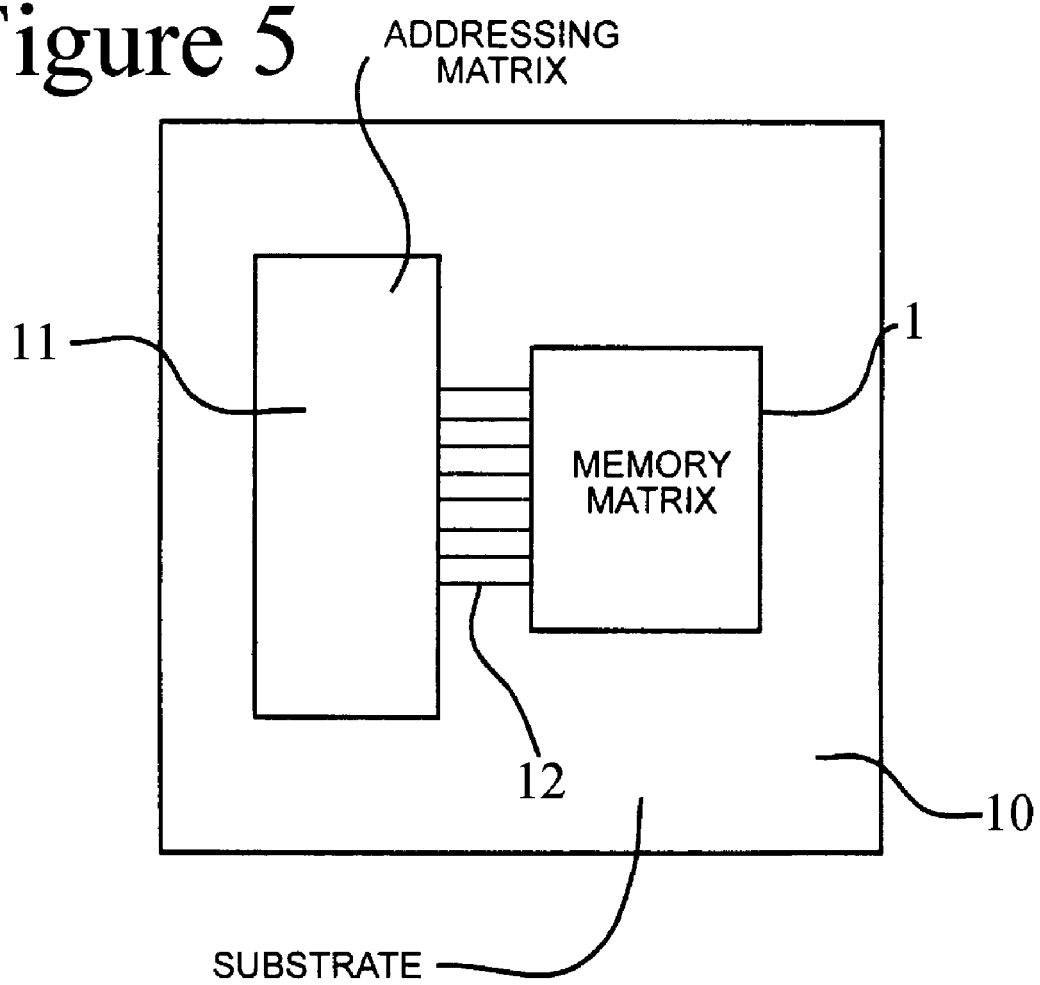

METHOD FOR FORMING CHALCOGENIDE SWITCH WITH CRYSTALLIZED THIN FILM DIODE ISOLATION

RELATED APPLICATION INFORMATION

This application is a divisional of U.S. patent application Ser. No. 11/501,255, entitled "Chalcogenide Switch with Laser Recrystallized Diode Isolation and Use Thereof in Three Dimensional Memory Arrays", filed on Aug. 8, 2006, now U.S. Pat. No. 7,838,864 the disclosure of which is incorporated in its entirety herein.

FIELD OF THE INVENTION

The present invention relates generally to three-dimensional memory arrays and more specifically to improvements to one-time-programmable, three-dimensional memory arrays. More specifically the present invention relates to the addition of a top-most layer of reprogrammable memory to the one-time-programmable, three-dimensional memory array. The reprogrammable memory elements preferably are non-volatile, chalcogenide based, phase change memory elements and preferably employ silicon diodes, chalcogenide based threshold switches, or both as electrical isolation devices for the reprogrammable memory elements.

BACKGROUND OF THE INVENTION

There is an ever-increasing demand for ever-denser semiconductor memories, and customers continue to purchase these memories in ever-greater quantities, even as the number of bits per chip quadruples (approximately) every three years. Increasingly higher densities are required, at ever lower costs, to meet the needs of the marketplace.

Semiconductor nonvolatile memories may be divided into two categories: (1) those in which data is permanently written during the manufacturing process and whose contents cannot be subsequently changed, called "mask ROMs" or "factory programmed ROMs"; (2) those in which data may be supplied after the finished memory device leaves the factory. This latter category is called "field programmable memories" because their contents may be written, by the user, when the semiconductor memory chip is deployed to its final application, "in the field".

Field programmable memories are further subdivided into "write once" memories and "write/erase/rewrite" memories. Those written once are referred to as "PROM" (programmable read only memories) or "OTP ROM" (one time programmable read only memories). And those memories that provide write/erase/rewrite capabilities have been referred to as "UVEPROM" (ultraviolet erasable programmable read only memories) or "EEPROM" (electrically erasable programmable read only memories) or "Flash EEPROM" (fast and flexible EEPROMs). In contrast, the contents of mask ROMs are permanently stored during manufacture, therefore mask ROMs are not erasable and are effectively "write only once, at the factory" memories.

Field programmable memories are much more flexible than mask ROMs, since they allow system product makers to inventory a single general part-type for many applications, and to personalize (program the memory contents of) this one part-type in numerous different ways, much later in the system product flow. This flexibility lets system manufacturers more easily adapt to fluctuations in demand among different system products, and to update or revise system products without the expense of scrapping (discarding) existing inventories of pre-programmed mask ROMs, but this flexibility has a cost. Field programmable memories generally achieve lower densities (fewer bits per chip) and higher cost (larger price per bit) than mask ROMs. Customers would prefer to buy something that offers the flexibility and convenience of a field programmable memory, while achieving the cost and density of a mask ROM. Unfortunately, such a device has yet not been available.

There were two reasons why mask ROMs were denser and cheaper than field programmable memories. First, since mask ROMs do not support erase or rewrite functions, their peripheral circuits need not contain any dedicated circuitry or I/O terminals for input-data steering, for write timing, or for write control. Thus the peripheral circuits of a mask ROM may be smaller than those of a field programmable nonvolatile memory. This reduces the die size of a mask ROM, compared to the die size of a field programmable nonvolatile memory, allowing more mask ROM chips to fit on a semiconductor wafer, which lowers costs. Second, since mask ROMs are written only at the factory, their memory cells may be designed and optimized for read operations exclusively, and generally their memory cells consist of only a single circuit element (e.g. a single MOS transistor). In contradistinction, the memory cell of a field programmable nonvolatile memory must include support for write operations. Therefore, field programmable memory cells generally contained more than one circuit element: generally a second tunnel oxide floating gate, or a write/erase series transistor, is added to the single MOS transistor needed for reading. The extra element(s) in the field programmable cell consume additional silicon area, making the memory cell area larger than the area of a mask ROM memory cell. Thus the density of field programmable nonvolatile memories has been lower than the density of mask ROMs.

Field programmable memories having write/erase/rewrite capabilities offer yet more flexibility. They permit product upgrades, field reconfiguration, and enable a host of new applications such as digital photography, solid state disks, et cetera. Unfortunately, these devices have generally suffered from lower density and higher cost than one-time programmable memories.

Turning now to the design of the memory cell used in these memories, most nonvolatile memory cells have employed semiconductor devices such as MOS field-effect transistors, junction transistors, or junction diodes, built in a planar monocrystalline semiconductor substrate. This approach allows only very limited integration vertically into the third dimension (i.e. perpendicular to the plane of the substrate), since each memory cell contains some elements built in the substrate. In the late 1990's one time programmable 3D memory arrays were devised using diodes and anti-fuse type programmable elements. Specific examples of such devices can be seen in U.S. patents and published applications to Matrix Semiconductor. These patents and published applications include U.S. Pat. Nos. 6,034,882; 6,185,122; 6,483,736; 6,525,953; 6,642,603; 6,780,711; 6,853,049; 6,984,561 and 6,995,422, and 2005/0158950 the disclosures of which are hereby incorporated by reference. These 3D devices may be fabricated by methods described in "Vertical p-i-n Polysilicon Diode With Antifuse for Stackable Field-Programmable ROM" by S. B. Herner, et al., published in IEEE ELECTRON DEVICE LETTERS, VOL. 25, NO. 5, MAY 2004, p. 271-273.

These 3D memory arrays are very useful for what they bring to the field programmable memory market, but they lack a key feature which is very desirable. For all of their cost and space savings, these memory devices are often not reprogrammable, other than those of the published application 2005/0158950 cited above. That is none of the memory elements can be erased or rewritten. Thus, there is a need in the art to enhance the 3D memory arrays of the prior art by using reprogrammable memory elements. Unfortunately, as discussed above most reprogrammable memory devices on the market are composed of additional silicon semiconductor devices that do not stack 3D.

Methods for making the polydiode stack reprogrammable are described in U.S. Published Patent Application no. 2005/0158950 published Jul. 21, 2005. However, because the reprogrammable material deteriorates at the higher temperatures required to crystallize the polydiode (e.g. 500-700° C.), there is a need for a lower cost 3D stackable approach with reprogrammable memory.

SUMMARY OF THE INVENTION

The present invention relates to multilayered three dimensional memory arrays having one or more layers of two-dimensional arrays of one time programmable anti-fuse type memory elements coupled with rapidly thermally annealed or laser recrystallized silicon diode isolation devices and a top layer comprising a two-dimensional array of non-volatile, reprogrammable, chalcogenide-based phase change memory elements with rapidly thermally annealed or laser recrystallized silicon diode isolation devices.

A second aspect of the present invention relates to multilayered three dimensional memory arrays having one or more layers of two-dimensional arrays of one time programmable anti-fuse type memory elements coupled with a rapidly thermally annealed or laser recrystallized silicon diode isolation devices and a top layer comprising a two-dimensional array of reprogrammable chalcogenide based phase change memory elements with chalcogenide based threshold switching isolation devices.

A third aspect of the present invention relates to multilayered three dimensional memory arrays having one or more layers of two-dimensional arrays of one time programmable anti-fuse type memory elements coupled with rapidly thermally annealed or laser recrystallized silicon diode isolation devices and a top layer comprising a two-dimensional array of a non-volatile reprogrammable chalcogenide based phase change memory element coupled with both rapidly thermally annealed or laser recrystallized silicon diode isolation devices and chalcogenide based threshold switching isolation devices.

Additional features and advantages of the various aspects of the present invention will become apparent from the description of its preferred embodiments, which description should be taken in conjunction with the accompanying drawings. For example, the diode may be replaced with a MIM device.

BRIEF DESCRIPTION OF THE DRAWINGS

FIG. 5 shows a schematic depiction of portion of a substrate having a memory matrix according to the present invention formed thereon along with an addressing matrix which is connected by integrated circuitry connections to the memory matrix. Some or all of the addressing matrix may be placed underneath the memory matrix.

DETAILED DESCRIPTION OF THE INVENTION

The present invention relates to improvements over prior art three-dimensional one time programmable (OTP) memory arrays. Examples of OTP arrays for which the present invention is an improvement are disclosed in U.S. Pat. Nos. 6,034,882; 6,185,122; 6,483,736; 6,515,888; 6,525,953; 6,642,603; 6,780,711; 6,853,049; 6,984,561; 6,995,422; and 7,026,212, the disclosures of which are herein incorporated by reference. These prior art three-dimensional memory arrays consist of multiple layers of two-dimensional memory arrays formed of OTP memory elements. The OTP memory elements are typically anti-fuse devices. The anti-fuse device is in a non-conductive state until programmed and is then converted, permanently, to a conductive state (i.e. are one time programmed). The anti-fuse of the OTP memory element is not designed to be converted back to the non-conductive state and as such none of the memory elements of the three-dimensional array can be erased/reprogrammed. The present invention replaces the top most two-dimensional OTP memory array of the prior art with a two-dimensional array of reprogrammable memory elements. This adds a degree of freedom to the design of electronic equipment which employs the inventive three-dimensional memory arrays.

Figure 1:
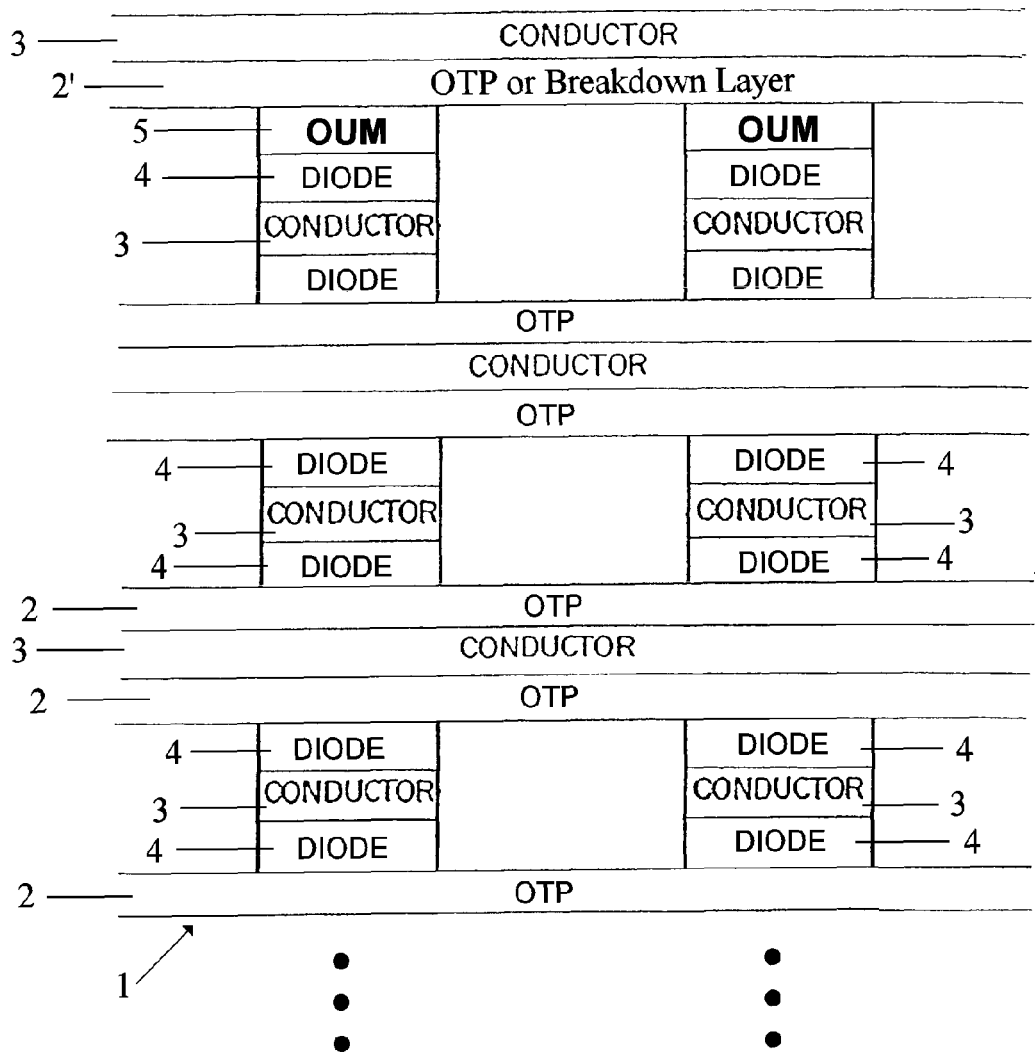
FIG. 1 is a schematic cross-section of a three-dimensional memory array according to one aspect of the present invention, specifically shown is the use of an OUM and a diode together as the top-most memory layer.

Turning to FIG. 1, there is shown a schematic cross-section of a three-dimensional memory array 1 according to one aspect of the present invention. The three-dimensional memory array consists of two-dimensional memory arrays stacked vertically. Each of the lower two-dimensional memory includes a plurality of OTP memory devices. The OTP memory devices include an OTP memory layer 2, a pair of conductive electrodes or leads 3 and a electrical isolation device such as a silicon diode 4. The OTP memory material 2 is typically an anti-fuse material.

It should be noted that while each individual OTP memory cell can include individual volumes of material for its memory layer, conductors, and diode, these materials may also be part of individual rails or strips of such materials which cross each other at right angles. The individual devices then consist of those portions of the rails or strips which are adjacent to the cross-point. Constructing memory arrays in this manner facilitates ease of construction and promotes self alignment of the structures.

Each memory cell shares at least one conductor or lead 3 with another cell from another layer. The column for one layer may be the row for another. Thus, memory cells in any individual layer may share conductors 3 with the memory cell in the layer above it or the layer below it or both. This sharing of conductors facilitates ease of construction, reduces complexity of the device, reduces the total volume of the three-dimensional array and reduces the amount of external circuitry needed to control the memory array.

Unlike the prior art devices of the patents listed above, the final or top memory layer of the instant invention also includes a reprogrammable memory material 5 in series with a diode, and optionally may also include an OTP layer. The reprogrammable memory material 5 may be a phase change material. The phase-change materials may be any phase change memory material known in the art such as a chalcogenide, Ovonyx Universal Memory or OUM. Preferably, the phase change materials are capable of exhibiting a first order phase transition. Examples of materials are described in U.S. Pat. Nos. 5,166,758, 5,296,716, 5,414,271, 5,359,205, 5,341, 328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. In one embodiment, the memory material comprises the elements Te, Ge and Sb. In another embodiment, the memory material consists essentially of Te, Ge and Sb. An example of a memory material which may be used is $Te_2Ge_2Sb_5$.

Figure 2:
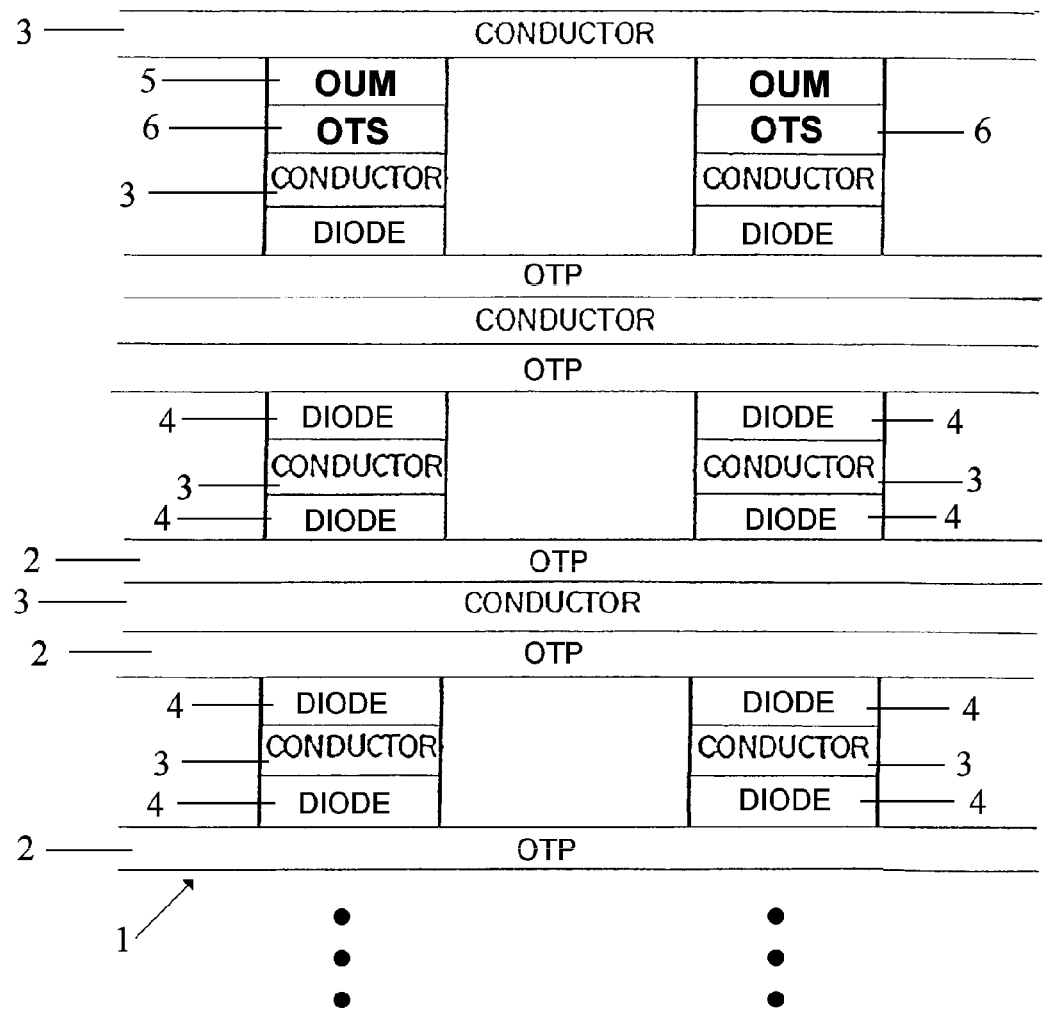
FIG. 2 is a schematic cross-section of a three-dimensional memory array according to a second aspect of the present invention; specifically shown is the use of an OUM and an OTS as the top-most memory layer.

Turning now to FIG. 2, there is shown a schematic cross-section of a three-dimensional memory array 1 according to a second aspect of the present invention. The three-dimensional memory array is basically the same as in FIG. 1 except that instead of a silicon diode isolation device, a chalcogenide-based threshold switch 6 (also know as an Ovonic Threshold Switch or OTS) is used for isolation. The OTS is typically a thin-film device suitable for use in a 3D stack above the base material, which may be silicon.

The characteristics of the Ovonic threshold switch are well known in the art. The switch presents a high resistance for voltages below a threshold level Vt. When the threshold voltage is exceeded, the switch triggers and conducts at a substantially constant voltage $V_c + I \times dv/di$ where $dv/di$ is the dynamic resistance after triggering and $V_c$ is the holding voltage. When conducting, the switch exhibits a low impedance until the current falls below a holding current. When the current through the switch falls below a holding current $I_h$, the switch reverts to its high-impedance state; this occurs when the voltage across the switch falls below the lesser level $V_c$. The switching action may be independent of the polarity of the applied voltage, and switching in both directions is rapid.

Threshold switching materials useful in the three-dimensional memory array of the present invention of the present invention may be As—Te based chalcogenides. They may additionally include elements such as Ge, Si, P, S and Se. One composition which is useful is $As_{41}Te_{39}Ge_5Si_{14}P_1$, wherein the subscripts are the atomic ratios of the respective elements. This basic material may be modified by substituting Se for either or both of As and Te. Two examples of such a modified composition are $As_{38}Te_{37}Ge_5Si_{14}P_1Se_5$ and $As_{36}Te_{34}Ge_5Si_{14}P_1Se_{10}$. In addition to modification by substitution of Se, additional Si can be substituted for either or both of As and Te. Examples of Si substitution are $As_{38}Te_{37}Ge_5Si_{19}P_1$ and $As_{36}Te_{34}Ge_5Si_{24}P_1$. Examples of thin-film OTS devices and structures are disclosed in U.S. Pat. No. 5,177,567; the disclosure of which is herein incorporated by reference.

Figure 3:
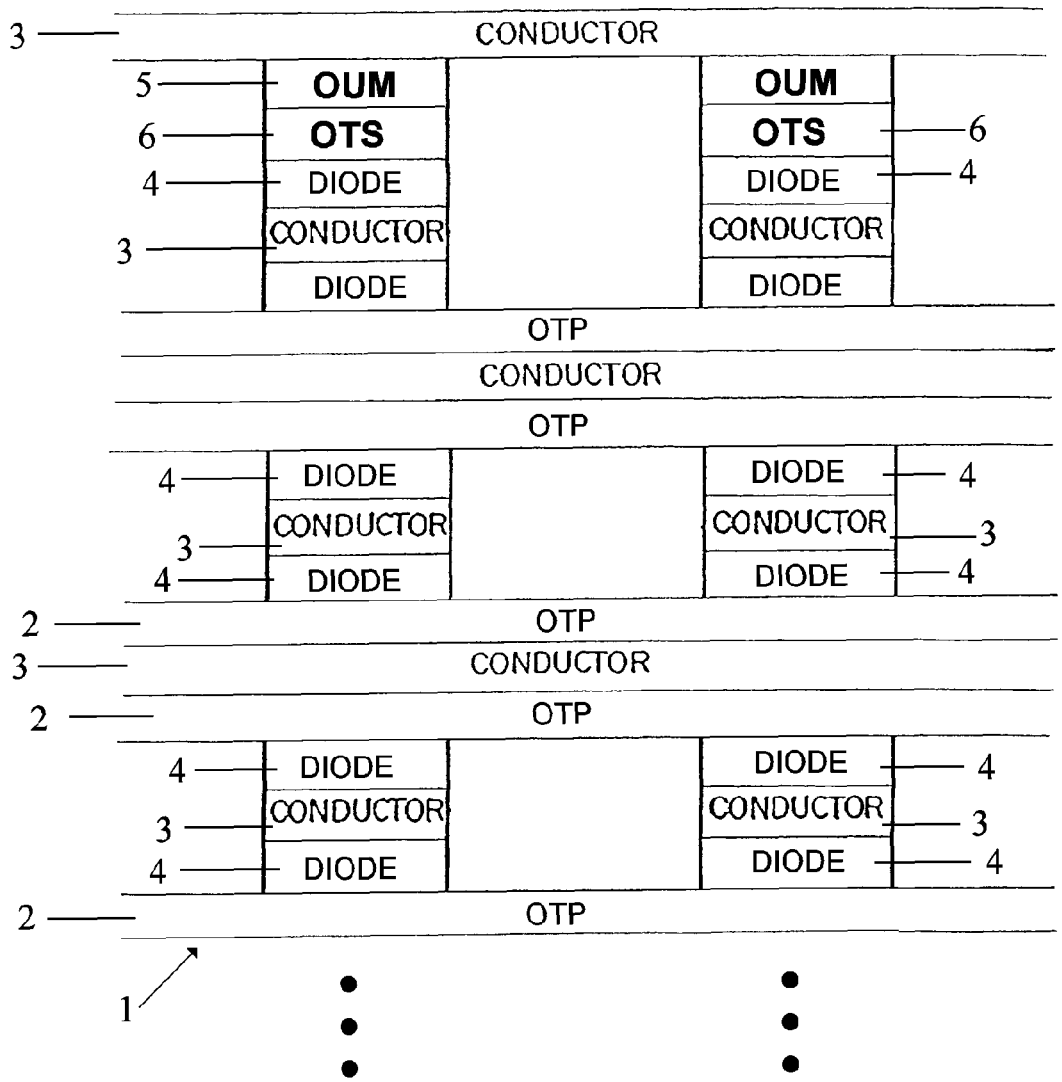
FIG. 3 is a schematic cross-section of a three-dimensional memory array according to a third aspect of the present invention; specifically shown is the use of an OUM, an OTS, and a diode as the top-most memory layer.

Turning now to FIG. 3, there is shown a schematic cross-section of a three-dimensional memory array 1 according to a second aspect of the present invention. The three-dimensional memory array is basically the same as in FIGS. 1 and 2 except that both a silicon diode 4 and a chalcogenide-based threshold switch 6 are used for isolation. When used together in series, the combination of the diode and the threshold switch provide enhanced off-state resistance or in other words, reduced leakage current in the off state.

Figure 4:
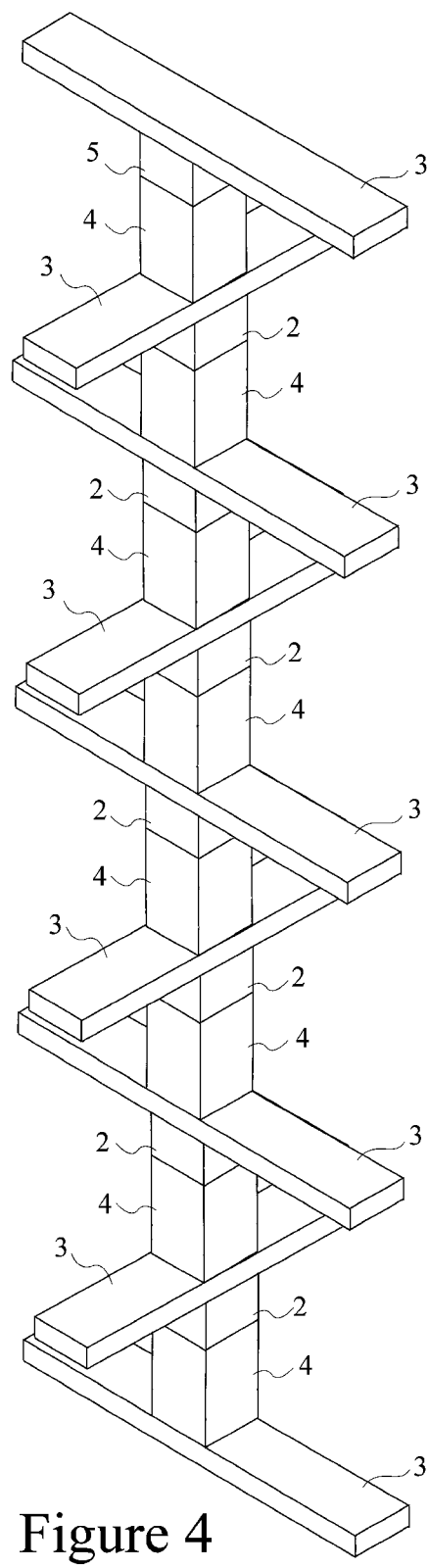
FIG. 4 depicts a schematic of a three-dimensional memory array according to one embodiment of the present invention, specifically shown is a single vertical stack of memory cells, isolation devices and conductors in three-dimensional perspective.

Turning now to FIG. 4, there is depicted therein a schematic depiction of a three-dimensional memory array according to one of the embodiments of the present invention. Specifically, FIG. 4 shows a single vertical stack of memory cells. Conductor lines 3 are used to access and program OTP memory elements 2 (or reprogrammable memory element 5), using silicon diode isolation devices 4. FIG. 4 illustrates the manner in which the conductor lines 3 may be positioned for multilayer access, but is not limiting. That is, the row for one layer need not be shared as the column for another. Instead, additional insulated rows and columns may be used so each layer is more independently accessed relative to the layer(s) above or below. It should be noted that while FIG. 4 only shows a single vertical stack of memory elements, each of the layers of the vertical stack actually are two-dimensional arrays of memory elements comprising, in toto, a three-dimensional array. Further, while FIG. 4 also shows each memory element (2 or 5) and each diode layer (4) as individual discrete volumes of material, it is typical, useful and desirable in the art to form these layers as strips or rails and to define each individual memory element or diode as that portion disposed in the cross-point of the two conductors 3, and as such devices formed using rails are a part of the present invention.

The diodes of the present invention are produced by methods used in the fabrication of the prior art three-dimensional OTP memory arrays. These processes include diode component formation using solid-phase crystallization of amorphous silicon, laser crystallization of amorphous or polycrystalline silicon, and other processes apparent to persons skilled in the art. That is, in one embodiment the semiconductor layers within the layer stack of the diode 4 may be deposited as microcrystalline or polycrystalline, and then laser treated to improve crystallinity and enhance the dopant activation. These techniques are known in the art as rapid thermal annealing and/or laser-recrystallization and the details of such processes are known in the art. One note is of relevance here though. Since the rapid thermal annealing (or laser recrystallization) process causes significant local heating, for the embodiments herein, an additional layer of diode and memory are preferably not added above the single top-most layer of reprogrammable, non-volitive, chalcogenide-based memory layer 5 because the heating of the silicon diode materials will cause significant heating to the chalcogenide layer, causing the material to be deleteriously changed and/or destroyed.

Of course the matrix layers of memory material are not, of themselves useable as a memory array without the proper peripheral circuitry. To this end, FIG. 5 shows a portion of a substrate 10 with a memory matrix 1 of the present invention formed thereon. Also formed on the same substrate 10 is an addressing matrix 11 which is suitably connected by integrated circuitry connections 12 to the memory matrix 1. The addressing matrix 11 includes signal generating means which define and control the setting and reading pulses applied to the memory matrix 1. Of course, the addressing matrix 11 may be integrated with and formed simultaneously with the solid state memory matrix 1. Though address lines come from one side diagrammatically in FIG. 5, this is not limiting. A dense implementation of the embodiments herein may have address lines from each side of the array, perhaps interleaved to allow more "pitch" for the addressing circuitry on the ends or underneath. Further, insulating (breakdown) layer used in the lower levels may be placed between the diode and its electrodes or conductor to reduce leakage current. Also, an insulating (breakdown) layer may be placed between the reprogrammable layer to reduce its programming current and/or reduced its leakage (until programmed the first time).

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

The invention claimed is:

1. A method of making a three-dimensional memory array comprising:
   depositing one or more two-dimensional memory arrays of one-time programmable memory elements arranged in horizontal layers and stacked vertically upon one another, said one-time programmable memory elements being irreversibly programmable from a first state to a second state; and
   depositing a two-dimensional memory array of reprogrammable phase change memory elements stacked on said one or more two-dimensional memory arrays of one-time programmable memory elements.

2. The method of claim 1, wherein said two-dimensional memory array is the top memory layer of said three-dimensional memory array.

* * * * *